(12) United States Patent
Takemura et al.

(10) Patent No.: US 7,888,801 B2
(45) Date of Patent: Feb. 15, 2011

(54) SEMICONDUCTOR DEVICE

(75) Inventors: Koji Takemura, Osaka (JP); Hiroshige Hirano, Nara (JP); Yutaka Itoh, Kyoto (JP); Hikari Sano, Hyogo (JP); Masao Takahashi, Kyoto (JP); Koji Koike, Osaka (JP)

(73) Assignee: Panasonic Corporation, Osaka (JP)

( * ) Notice: Subject to any disclaimer, the term of this patent is extended or adjusted under 35 U.S.C. 154(b) by 101 days.

(21) Appl. No.: 12/430,439

(22) Filed: Apr. 27, 2009

(65) Prior Publication Data

US 2009/0200677 A1    Aug. 13, 2009

Related U.S. Application Data

(62) Division of application No. 11/452,957, filed on Jun. 15, 2006, now Pat. No. 7,538,433.

(30) Foreign Application Priority Data

Jun. 16, 2005    (JP)    ............................. 2005-176824

(51) Int. Cl.
*H01L 23/522*    (2006.01)

(52) U.S. Cl. ............................... 257/758; 257/E23.145

(58) Field of Classification Search ................. 257/750, 257/774, 758, 762, 623, 626; 438/462, 465
See application file for complete search history.

(56) References Cited

U.S. PATENT DOCUMENTS

| 5,834,829 | A | 11/1998 | Dinkel et al. |
| 6,365,958 | B1 | 4/2002 | Ibnabdeljalil et al. |
| 7,335,577 | B2 | 2/2008 | Daubenspeck et al. |

FOREIGN PATENT DOCUMENTS

| JP | 2003-243401 | 8/2003 |
| JP | 2004-153015 | 5/2004 |

*Primary Examiner*—Roy K Potter
(74) *Attorney, Agent, or Firm*—McDermott Will & Emery LLP

(57) ABSTRACT

A semiconductor device includes at least three or more wiring layers stacked in an interlayer insulating film on a semiconductor substrate, a seal ring provided at the outer periphery of a chip region of the semiconductor substrate and a chip strength reinforcement provided in part of the chip region near the seal ring. The chip strength reinforcement is made of a plurality of dummy wiring structures and each of the plurality of dummy wiring structures is formed to extend across and within two or more of the wiring layers including one or none of the bottommost wiring layer and the topmost wiring layer using a via portion.

17 Claims, 13 Drawing Sheets

SEMICONDUCTOR DEVICE

RELATED APPLICATIONS

This application is a divisional of U.S. patent application Ser. No. 11/452,957, filed Jun. 15, 2006, now U.S. Pat. No. 7,538,433 claiming priority of Japanese Patent Application No. 2005-176824, filed Jun. 16, 2005, the entire contents of each of which are hereby incorporated by reference.

BACKGROUND OF THE INVENTION

1. Field of the Invention

The present invention relates to a semiconductor device including three or more wiring layers.

2. Description of Related Art

According to the growing digitization of our society, demand for high-performance and high-speed semiconductor devices is increasing. In order to meet the demand, large-scale integration of the semiconductor devices has been proceeding while the multi-layering and miniaturization of wiring are involved in. In recent years, in order to reduce parasitic capacitance derived from the miniaturization of the wiring for the purpose of enhancing the speed of the semiconductor devices, dielectric material having a lower dielectric constant (low-k material) has been used for an interlayer insulating film in place of conventional dielectric oxide material such as silicon oxide and silicon nitride.

Patent Document 1: Japanese Unexamined Patent Publication No. 2003-243401

Patent Document 2: Japanese Unexamined Patent Publication No. 2004-153015

SUMMARY OF THE INVENTION

The low dielectric constant material is significantly different in physical characteristic from the conventional dielectric oxide material. For example, the low dielectric constant material has low Young's modulus, low hardness, low adhesion property at the interface and a high thermal expansion coefficient. Therefore, in semiconductor devices using the low dielectric constant material, problems may arise such as the occurrence of peeling or crack at the interface of the interlayer insulating film below pads in the step of wire bonding or at the corners of the chip due to thermal stress after sealing. The crack, peeling or the like of the interlayer insulating film causes leakage between wirings or disconnection and brings about critical damage to the semiconductor devices.

According to a recent technique against such problems, dummy wiring structures are provided as a chip strength reinforcement separately from a seal ring provided at the outer periphery of a chip region of a semiconductor substrate (wafer). However, for example, if the stress is high, the crack, peeling or the like of the interlayer insulating film cannot be prevented enough by such a technique.

With respect to a semiconductor device including multi-layer wiring using interlayer insulating films made of dielectric material such as low dielectric constant material having low Young's modulus, low hardness, low adhesion property at the interface and a high thermal expansion coefficient, an object of the present invention is to surely prevent the crack, peeling or the like of the interlayer insulating film derived from mechanical or thermal stress.

As a result of examination of the reasons why the conventional chip strength reinforcement cannot fully prevent the crack or the like of the interlayer insulating film, the inventors of the present invention have made the following finding. A dummy wiring structure as the conventional chip strength reinforcement is formed through the topmost wiring layer to the bottommost wiring layer (or an impurity layer formed in the surface of the semiconductor substrate), just like the seal ring. Therefore, the dummy wiring structure may shrink due to a difference in stress-related coefficient (Young's modulus, etc., hereinafter it is referred to as a stress coefficient) between the wiring material and the interlayer insulating film material. As a result, stress is concentrated on the dummy wiring structure, thereby causing the peeling or the like of the interlayer insulating film.

The present invention has been achieved based on the above-described finding. Specifically, a semiconductor device of the present invention is a semiconductor device including at least three or more wiring layers stacked in an interlayer insulating film on a semiconductor substrate. The semiconductor device includes: a seal ring provided at the outer periphery of a chip region of the semiconductor substrate; and a chip strength reinforcement provided in part of the chip region near the seal ring, wherein the chip strength reinforcement is made of a plurality of dummy wiring structures and each of the plurality of dummy wiring structures is formed to extend across and within two or more of the wiring layers including one or none of the bottommost wiring layer and the topmost wiring layer using a via portion.

In the present specification, the dummy wirings are wirings not included in the semiconductor integrated circuit, i.e., those irrelevant to the electrical characteristics of the semiconductor device.

In the semiconductor device of the present invention, the bottommost wiring layer may be an impurity layer formed in the surface of the semiconductor substrate.

In the semiconductor device of the present invention, the dummy wiring structures may be replaced with wiring structures which are arranged in the same manner as the dummy wiring structures to function as signal lines or power source lines.

In the semiconductor device of the present invention, at least two of the plurality of dummy wiring structures have at least a portion formed in the same wiring layer, respectively, or alternatively, at least one of a pair of dummy wiring structures among the plurality of dummy wiring structures has a portion formed in one of the wiring layers in which the other of the pair is not formed.

In the semiconductor device of the present invention, it is preferable that at least two of the plurality of dummy wiring structures have a portion formed in the bottommost wiring layer, respectively.

In the semiconductor device of the present invention, it is preferable that at least one of the plurality of dummy wiring structures has a portion extending in a certain direction in at least one of the wiring layers and another portion extending in a different direction in the same wiring layer and being connected to the certain portion.

In the semiconductor device of the present invention, it is preferable that the plurality of dummy wiring structures include a first dummy wiring structure and a second dummy wiring structure whose topmost portion is positioned below the topmost portion of the first dummy wiring structure, at least two portions of the first dummy wiring structure are formed in at least two wiring layers, respectively, and at least two portions of the second dummy wiring structure are formed in the at least two wiring layers, respectively, and one of the at least two portions of the first dummy wiring structure formed in one of the at least two wiring layers and one of the at least two portions of the second dummy wiring structure formed in the other of the at least two wiring layers overlap each other when viewed in plan. In this case, it is preferable that the second dummy wiring structure is formed to extend across and within three or more wiring layers using via portions and configured in the form of a ring and a portion of the first dummy wiring structure is positioned inside the ring-shaped second dummy wiring structure. Further, it is more preferable that the first dummy wiring structure is formed to extend across and within three or more wiring layers using via portions and configured in the form of a ring and a portion of the second dummy wiring structure is positioned inside the ring-shaped first dummy wiring structure.

In the semiconductor device of the present invention, each of the plurality of dummy wiring structures may contain copper.

In the semiconductor device of the present invention, the plurality of dummy wiring structures are provided at the corners of the chip region outside the seal ring, or alternatively, the plurality of dummy wiring structures are provided at the corners of the chip region outside and inside the seal ring. Further, the plurality of dummy wiring structures may be provided at the corners of the chip region outside and inside the seal ring and along the outer periphery of the chip region except the chip corners, or alternatively, the plurality of dummy wiring structures are provided at the corners of the chip region inside the seal ring.

According to the present invention, the chip strength reinforcement made of the dummy wiring structures is provided separately from the seal ring. Therefore, even if the multilayered interlayer insulating film is made of dielectric material such as low dielectric constant material having low Young's modulus, low hardness, low adhesion property at the interface and a high thermal expansion coefficient, part of the interlayer insulating film near the dummy wiring structures improves in mechanical strength, particularly in the thickness direction. Further, as the chip strength reinforcement is made of a plurality of dummy wiring structures, each of which is formed to extend across and within two or more wiring layers including one or none of the bottommost and topmost wiring layers, stress concentration around the dummy wiring structures due to the difference in stress coefficient between the wiring material and the interlayer insulating film material is alleviated. In other words, stress is distributed to different points. As a result, the crack, peeling or the like of the interlayer insulating film derived from mechanical or thermal stress during assembly into a package or the like is prevented with reliability, thereby preventing the occurrence of failure.

As described above, the present invention relates to a semiconductor device including three or more wiring layers. If the invention is applied to a semiconductor device including multilayer wiring structures using an interlayer insulating film made of low dielectric constant material or the like, it effectively prevents the crack, peeling or the like of the interlayer insulating film derived from mechanical or thermal stress. Thus, the present invention is significantly useful.

DETAILED DESCRIPTION OF THE INVENTION

First Embodiment

Hereinafter, explanation of a semiconductor device and its manufacture method according to a first embodiment of the present invention will be provided with reference to the drawings.

Figure 1:
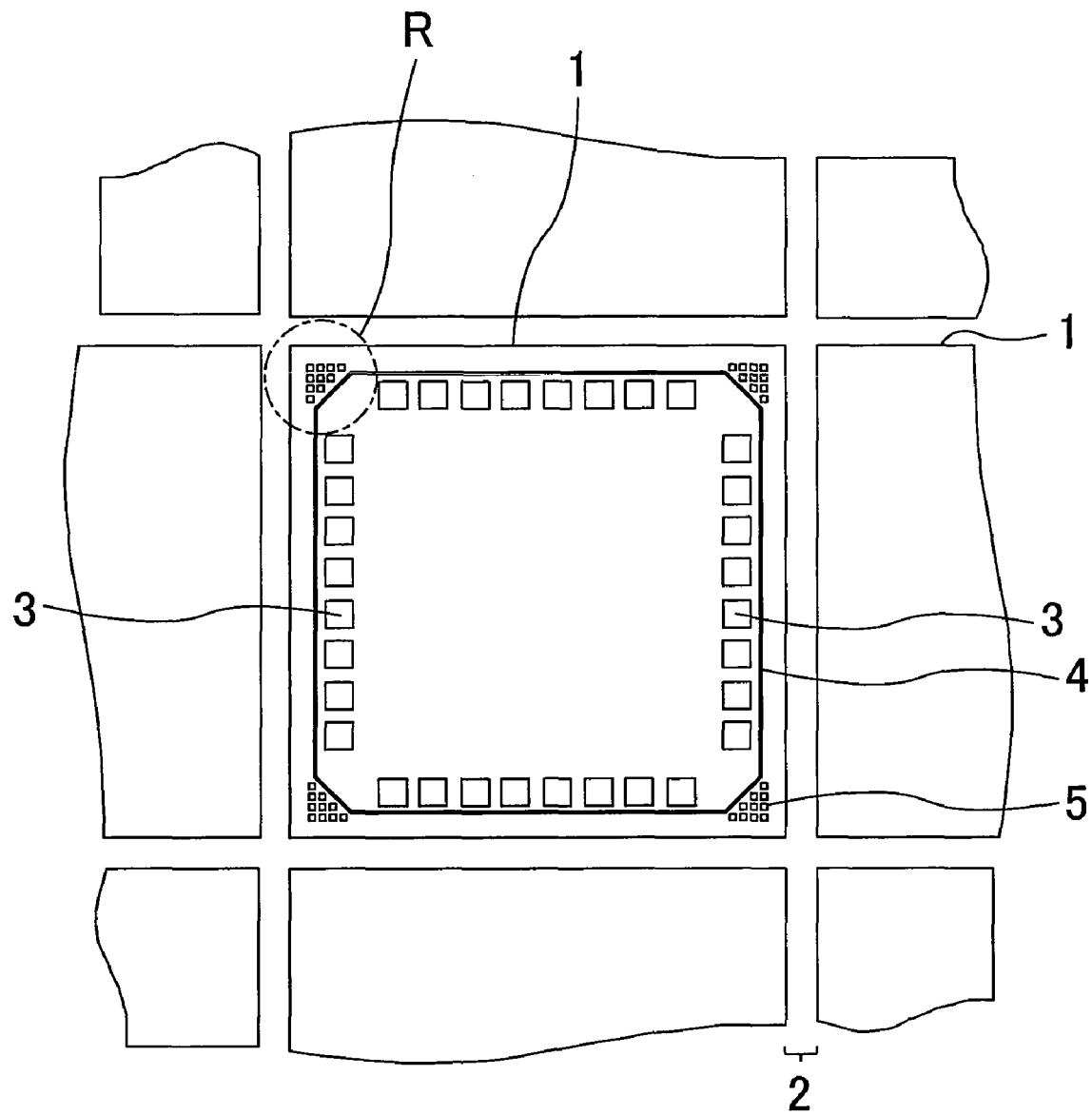
FIG. 1 is a plan view illustrating a semiconductor device according to a first embodiment of the present invention.
Figure 2:
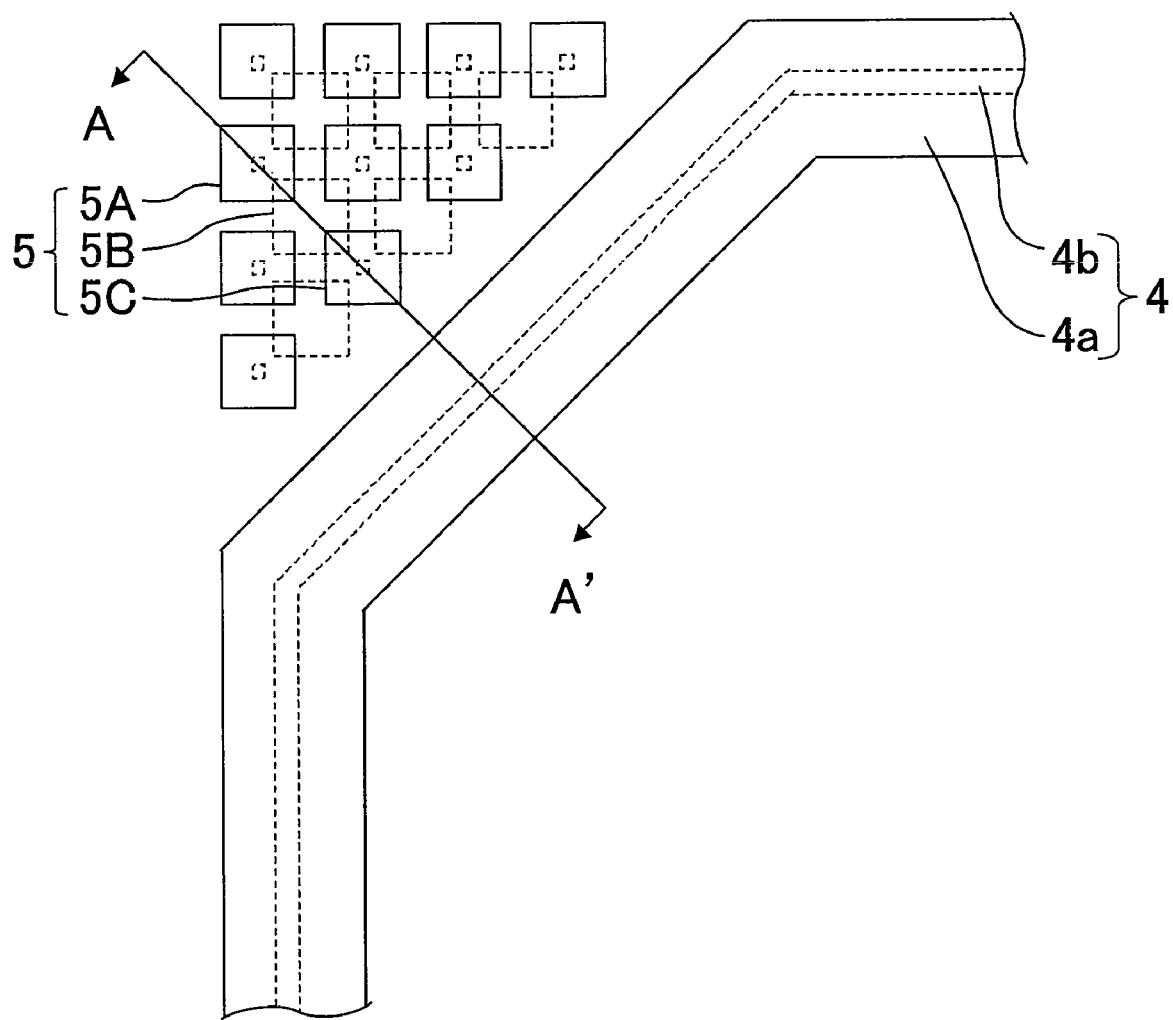
FIG. 2 is an enlargement of region R (the upper left corner of a chip region) shown in FIG. 1.

FIG. 1 is a plan view of a semiconductor device of the first embodiment, in particular a semiconductor chip provided with wiring structures. FIG. 2 is an enlargement of region R (the upper left corner of a chip region) shown in FIG. 1.

First, the configuration of the semiconductor device of the present embodiment will be explained with reference to FIGS. 1 and 2. As shown in FIGS. 1 and 2, a plurality of chip regions 1 are provided on a wafer as a semiconductor substrate (each of the chip regions will be a semiconductor chip after dicing). A scribed region 2 defines the chip regions 1. A seal ring 4 is provided at the periphery of each of the chip regions 1 to surround a circuit region and aluminum pads 3 are provided along the edge of the circuit region for electrical connection between the semiconductor chip and an external circuit. The seal ring 4 is prepared by stacking ring-shaped patterns (when viewed in plan) each including a via portion 4b and a wiring portion 4a formed thereon.

As described above, in a semiconductor device including an interlayer insulating film made of low dielectric constant material or the like, there are concerns about the occurrence of peeling, crack or the like at the interface of the interlayer insulating film below pads in the step of wire bonding or at the corners of the chip due to thermal stress after sealing.

In contrast, in the present embodiment described below, the semiconductor device is configured to prevent the interlayer insulating film from destruction. In particular, a chip strength reinforcement according to the present invention is provided near the seal ring 4 arranged at the periphery of the chip region 1.

Specifically, a chip strength reinforcement 5 of the present embodiment is provided at the corners of the chip region 1 outside the seal ring 4. The chip strength reinforcement 5 is made of a plurality of dummy wiring structures (e.g., dummy wiring structures 5A to 5C).

FIGS. 3 to 10 are sectional views illustrating the steps of a method for manufacturing the semiconductor device according to the first embodiment (sections taken along the line A-A' of FIG. 2).

Figure 3:
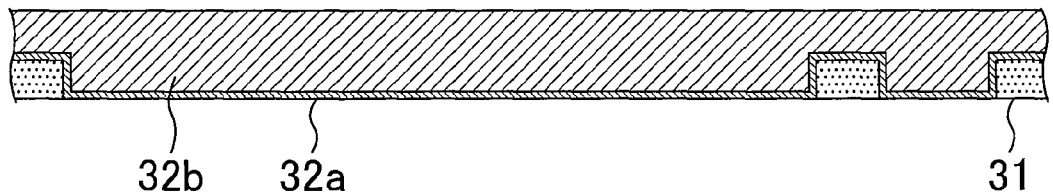
FIG. 3 is a sectional view illustrating a step of a method for manufacturing the semiconductor device of the first embodiment of the present invention.

As shown in FIG. 3, a first insulating film 31 made of a silicon oxide film, for example, is formed on a silicon substrate as a silicon wafer (not shown). A resist mask (not shown) having a pattern of wiring grooves is then formed on the first insulating film 31 by photolithography, and then the first insulating film 31 is partially removed by dry etching using the resist mask to form wiring grooves in the first insulating film 31.

On the first insulating film 31 provided with the wiring grooves, for example, a multilayer film 32a made of a stack of a tantalum nitride film and a tantalum film and a copper film 32b are deposited in this order.

Figure 4:
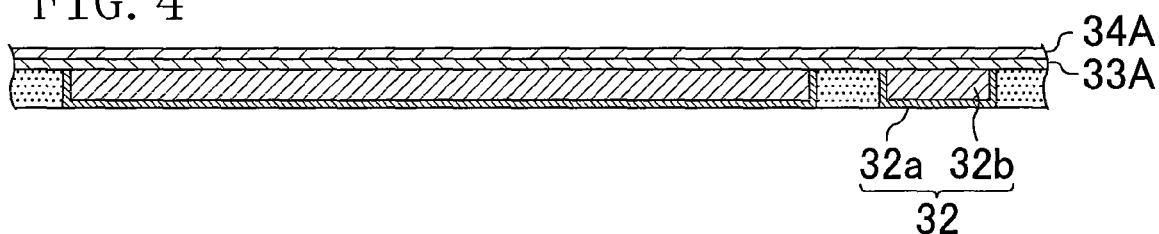
FIG. 4 is a sectional view illustrating a step of a method for manufacturing the semiconductor device of the first embodiment of the present invention.

Then, as shown in FIG. 4, part of the multilayer film 32a and part of the copper film 32b existing out of the wiring grooves are removed and the surface of the copper film 32b buried in the wiring grooves is planarized by CMP (chemical mechanical polishing), for example. Accordingly, a copper wiring (first (bottommost)-layer wiring) 32 is obtained. Subsequently, for example, a silicon carbon nitride film (SiCN film) is deposited over the copper wiring 32 as a second insulating film 33A of about 30 nm thick. On the second insulating film 33A, for example, a silicon carbon oxide film (SiCO film) is deposited as a third insulating film 34A of about 30 nm thick.

Figure 5:
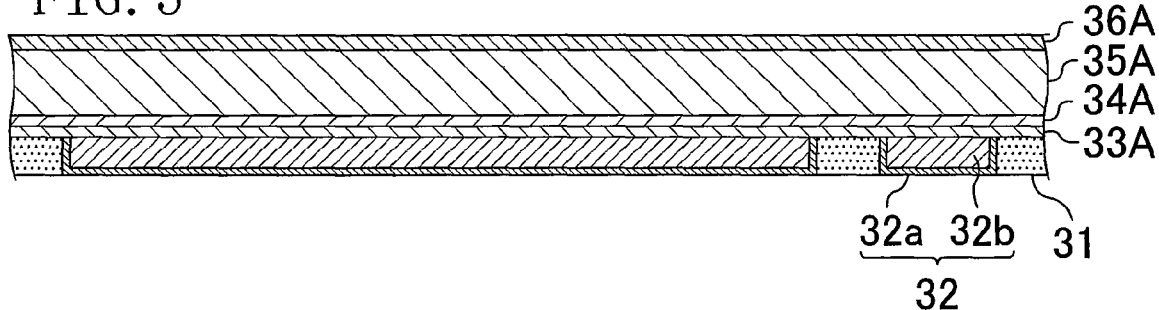
FIG. 5 is a sectional view illustrating a step of a method for manufacturing the semiconductor device of the first embodiment of the present invention.

On the third insulating film 34A, a carbon-containing silicon oxide film (SiOC film) is deposited as a fourth insulating film 35A of about 600 nm thick as shown in FIG. 5. The surface of the fourth insulating film 35A is polished by CMP to reduce its thickness by about 100 nm such that the surface of the fourth insulating film 35A is planarized. On the planarized fourth insulating film 35A, for example, a silicon oxide film is deposited as a fifth insulating film 36A of about 50 nm thick by CVD (chemical vapor deposition), for example.

Then, though not shown, an organic anti-reflection film is applied to the surface of the fifth insulating film 36A and a resist mask having a pattern of holes is formed on the organic anti-reflection film by photolithography.

Figure 6:
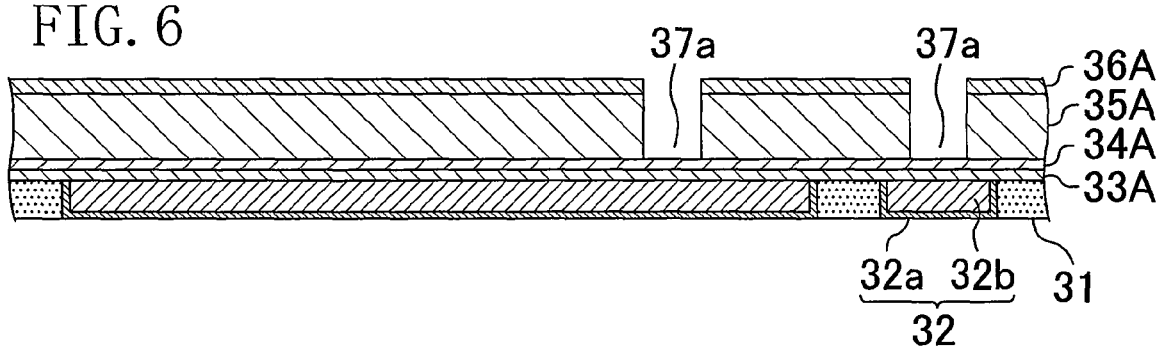
FIG. 6 is a sectional view illustrating a step of a method for manufacturing the semiconductor device of the first embodiment of the present invention.

As shown in FIG. 6, the organic anti-reflection film, fifth insulating film 36A and fourth insulating film 35A are partially removed by dry etching using the resist mask. Then, the resist mask and the organic anti-reflection film are removed by ashing. Accordingly, via holes 37a are formed in the fifth and fourth insulating films 36A and 35A.

Figure 7:
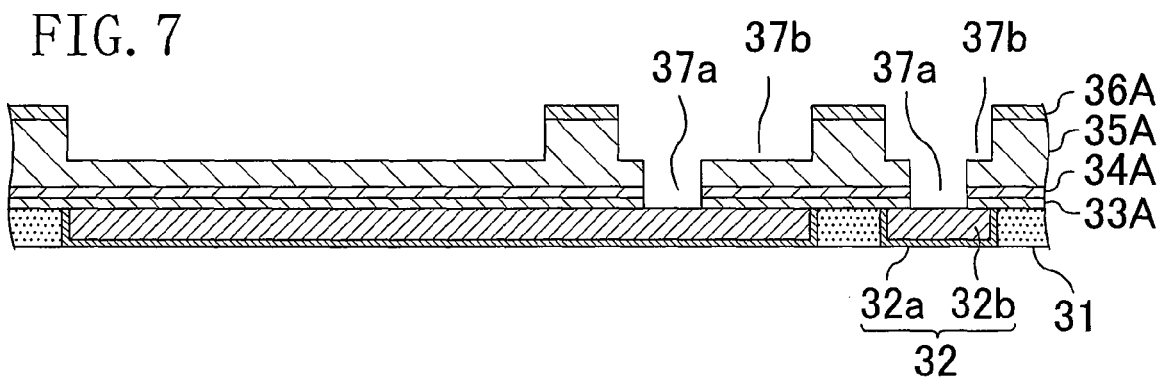
FIG. 7 is a sectional view illustrating a step of a method for manufacturing the semiconductor device of the first embodiment of the present invention.

Then, as shown in FIG. 7, the fifth and fourth insulating films 36A and 35A are partially removed by photolithography and dry etching to form wiring grooves 37b connecting with the via holes 37a. Then, the second insulating film 33A and the third insulating film 34A at the bottom of the via holes 37a are also removed such that the via holes 37a reach the copper wiring 32.

Figure 8:
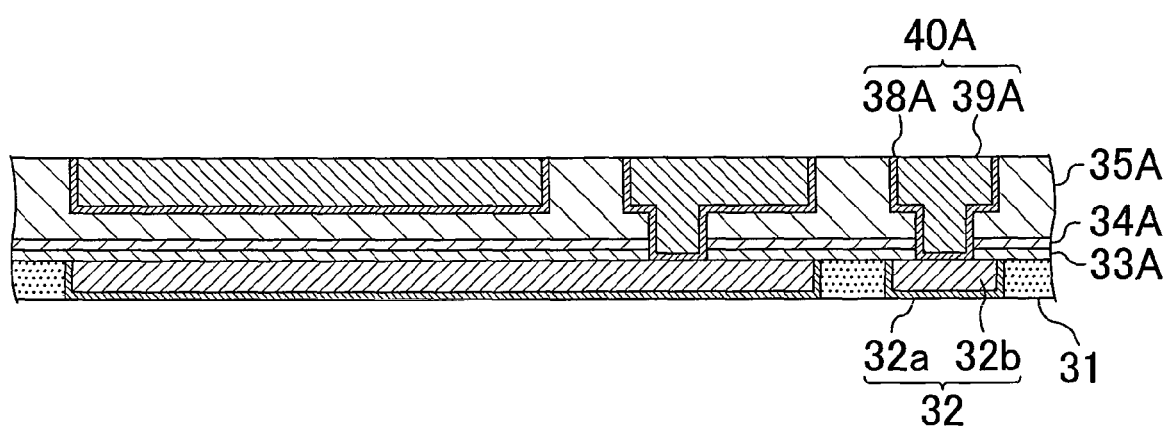
FIG. 8 is a sectional view illustrating a step of a method for manufacturing the semiconductor device of the first embodiment of the present invention.

On the fifth insulating film 36A provided with the via holes 37a and the wiring grooves 37b, for example, a multilayer film 38A made of a stack of a tantalum nitride film and a tantalum film and a copper film 39A are deposited in this order. Then, part of the multilayer film 38A and part of the copper film 39A existing out of the wiring grooves 37b are removed and the surface of the copper film 39A buried in the wiring grooves 37b is planarized by CMP, for example. Accordingly, a copper wiring (second-layer wiring) 40A is obtained as shown in FIG. 8. In this step, the fifth insulating film 36A is also removed.

Figure 9:
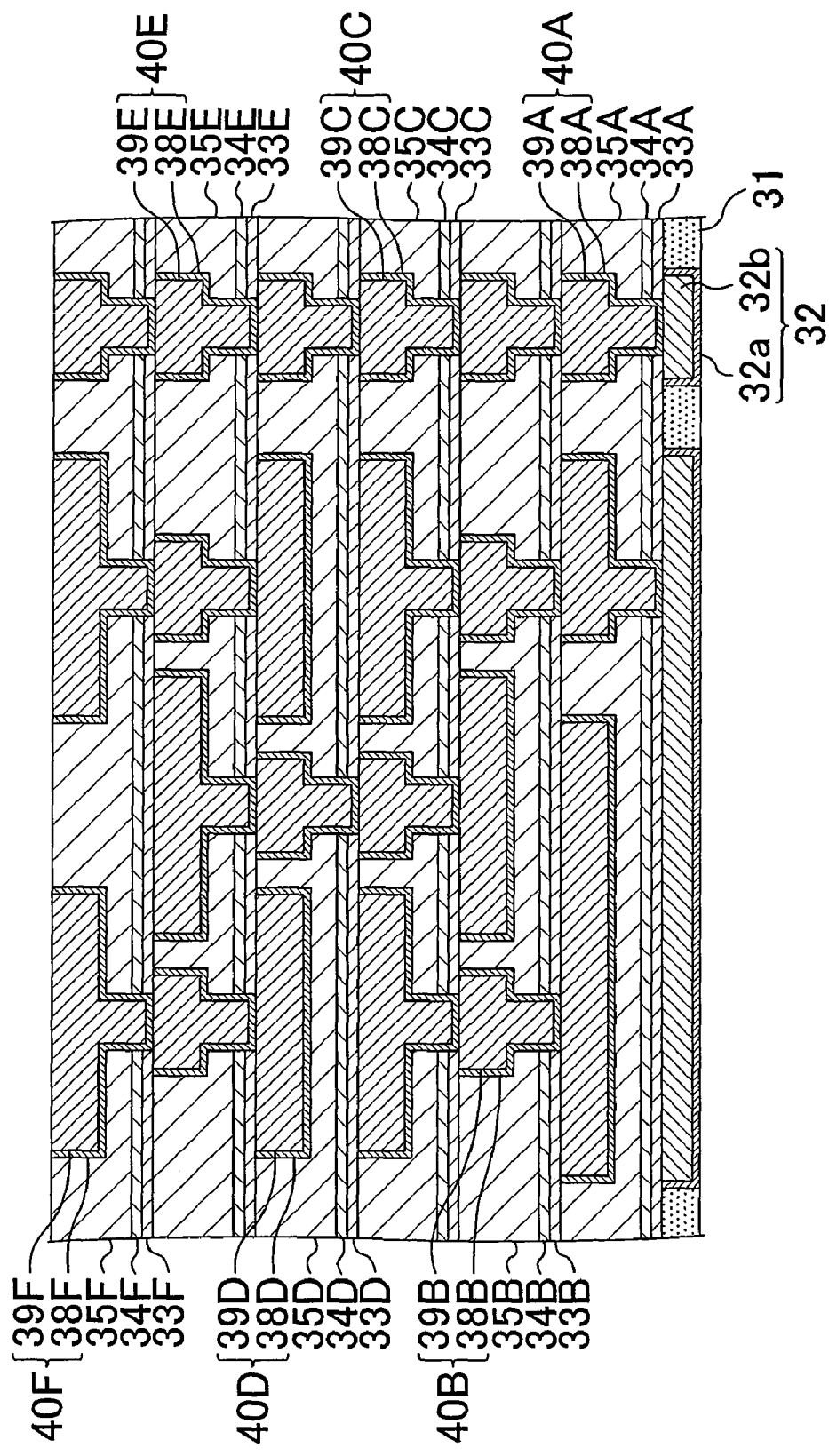
FIG. 9 is a sectional view illustrating a step of a method for manufacturing the semiconductor device of the first embodiment of the present invention.

The above-described steps (steps of forming the second and third insulating films 33A and 34A shown in FIG. 4) are repeated to form a multilayer wiring structure (in the present embodiment, a multilayer wiring structure including the first to seventh-layer wirings 32 and 40A to 40F) as shown in FIG. 9.

Figure 10:
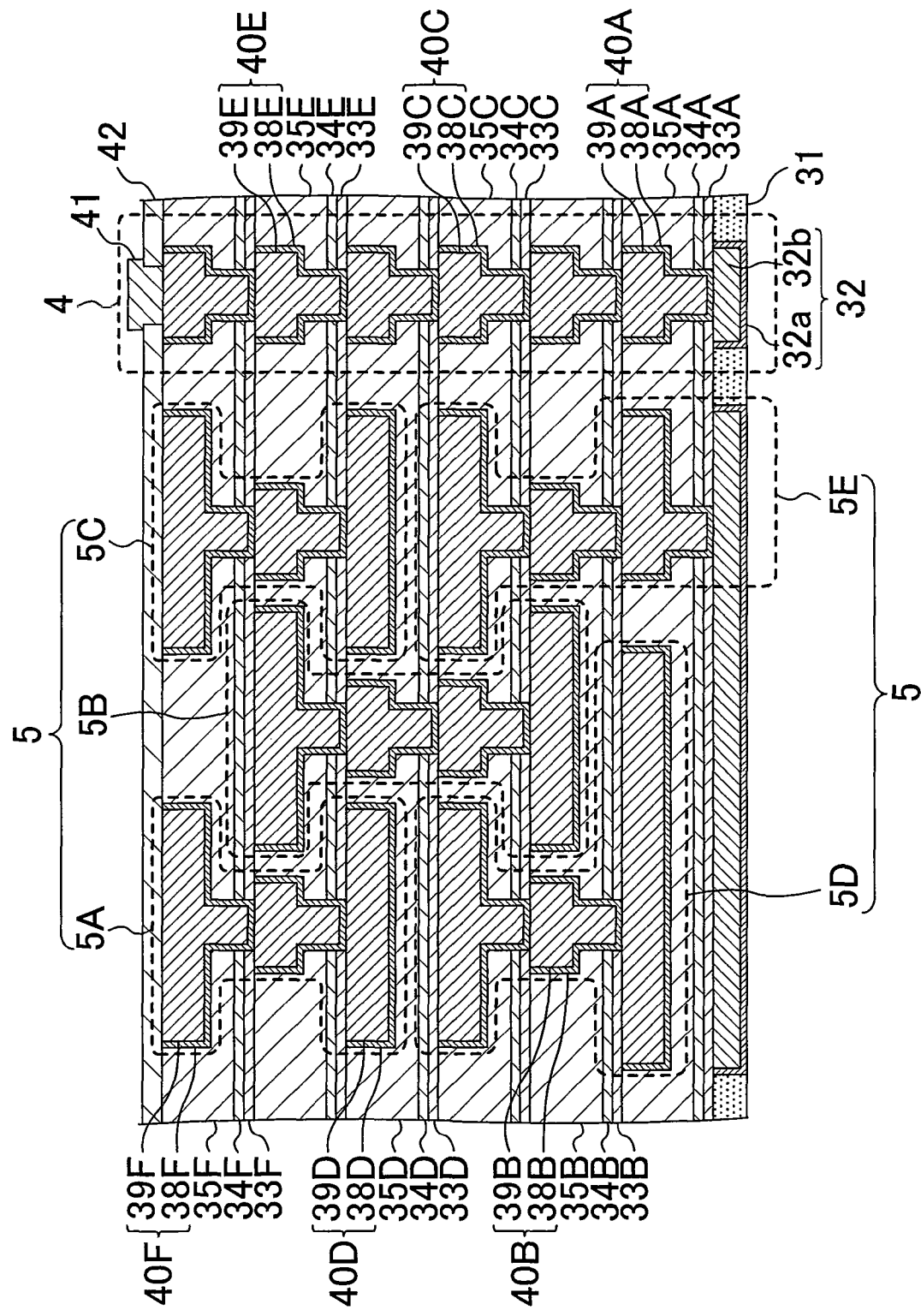
FIG. 10 is a sectional view illustrating a step of a method for manufacturing the semiconductor device of the first embodiment of the present invention.

Then, as shown in FIG. 10, for example, a silicon nitride film is deposited over the seventh-layer wiring 40F by CVD or the like as a sixth insulating film 42 of about 200 nm thick, an organic anti-reflection film (not shown) is applied to the surface of the sixth insulating film 42, and then a resist mask (not shown) having a pattern of holes is formed on the organic anti-reflection film by photolithography. Using the resist mask, the organic anti-reflection film and the sixth insulating film 42 are partially removed by dry etching, and then the resist mask and the organic anti-reflection film are removed by ashing. Accordingly, a contact hole reaching the seventh-layer wiring 40F is formed in the sixth insulating film 42. Then, for example, a multilayer film made of a stack of a titanium film and a titanium nitride film (not shown) and an aluminum film are deposited in this order on the sixth insulating film 42 provided with the contact hole. These films are then patterned into a cap 41.

Through the above-described steps, a seal ring 4 including the first (bottommost)-layer wiring 32, the second to seventh-layer wirings 40A to 40F and the cap 41 is provided at the periphery of each of the chip regions 1. Further, a chip strength reinforcement 5 made of a plurality of dummy wiring structures (e.g., dummy wiring structures 5A to 5E) is provided at each of the corners of the chip region 1 outside the seal ring 4. Each of the dummy wiring structures is formed to extend across and within two or more wiring layers including one or none of the bottommost and topmost wiring layers using the via portion. Among the plurality of dummy wiring structures, at least a portion of a dummy wiring structure and at least a portion of at least any other one of the dummy wiring structures are formed in at least one same wiring layer. Further, at least one of the dummy wiring structures has a portion formed in one of the wiring layers in which at least any other one of the dummy wiring structures are not formed.

Specifically, each of the dummy wiring structures 5A and 5C is made of a combination of the fifth to seventh-layer wirings 40D to 40F. The dummy wiring structure 5B is made of the third to sixth-layer wirings 40B to 40E and the dummy wiring structure 5D is made of the second to fourth-layer wirings 40A to 40C. Further, the dummy wiring structure 5E is made of the first to fourth-layer wirings 32 to 40C.

According to the first embodiment, the chip strength reinforcement 5 made of the dummy wiring structures is provided separately from the seal ring 4. Therefore, for example, even if the multilayered interlayer insulating film includes dielectric material such as low dielectric constant material having low Young's modulus, low hardness, low adhesion property at the interface and a high thermal expansion coefficient (e.g., the fourth insulating film 35A made of a carbon-containing silicon oxide film (SiOC film)), part of the interlayer insulating film near the dummy wiring structures improves in mechanical strength, particularly in the thickness direction. Further, as the chip strength reinforcement 5 is made of a plurality of dummy wiring structures formed to extend across and within two or more wiring layers including one or none of the bottommost and topmost wiring layers, i.e., the chip strength reinforcement 5 is not made of dummy wiring structures formed to extend through the bottommost to topmost wiring layers. Therefore, stress concentration around the dummy wiring structures due to the difference in stress coefficient between the wiring material and the interlayer insulating film material is alleviated. That is, stress is distributed to different points. As a result, the crack, peeling or the like of the interlayer insulating film derived from mechanical or thermal stress during assembly into a package or the like is prevented with reliability, thereby preventing the occurrence of failure.

Among the plurality of dummy wiring structures providing the chip strength reinforcement 5 of the first embodiment, if a first dummy wiring structure is positioned above a second dummy wiring structure and at least two portions of the first dummy wiring structure are formed in at least two wiring layers and at least two portions of a second dummy wiring structures are formed in the same at least two wiring layers, it is preferred to meet the following condition in order to prevent the crack, peeling or the like of the interlayer insulating film with reliability. Specifically, one of the at least two portions of the first dummy wiring structure formed in one of the at least two wiring layers and one of the at least two portions of the second dummy wiring structure formed in the other of the at least two wiring layers overlap each other when viewed in plan. More specifically, in the first embodiment shown in FIG. 10, the above-described condition is satisfied between the dummy wiring structures 5A and 5B, 5C and 5B, 5B and 5D, and 5B and 5E.

Among the plurality of dummy wiring structures serving as the chip strength reinforcement 5 of the first embodiment, if at least a portion of one dummy wiring structure formed in at least one of the wiring layers and at least a portion of another wiring structure formed in the same wiring layer are separated from each other, other portions of both of the dummy wiring structures formed in other wiring layers may be connected to each other.

Modified Example of First Embodiment

Hereinafter, explanation of a semiconductor device and its manufacture method according to a modified example of the first embodiment will be provided.

In the first embodiment described above, overlapping portions are observed between the dummy wiring structures 5A and 5B, 5C and 5B, 5B and 5D and 5B and 5E.

In the modified example, in contrast to the first embodiment, some or all of the overlapping portions of the dummy wiring structures are not provided. By so doing, the crack, peeling or the like of the interlayer insulating film derived from the mechanical or thermal stress during assembly into a package or the like is prevented with reliability while the area occupied by the dummy wiring structures is reduced.

Second Embodiment

Hereinafter, explanation of a semiconductor device and its manufacture method according to a second embodiment of the present invention will be provided with reference to the drawings.

Figure 11:
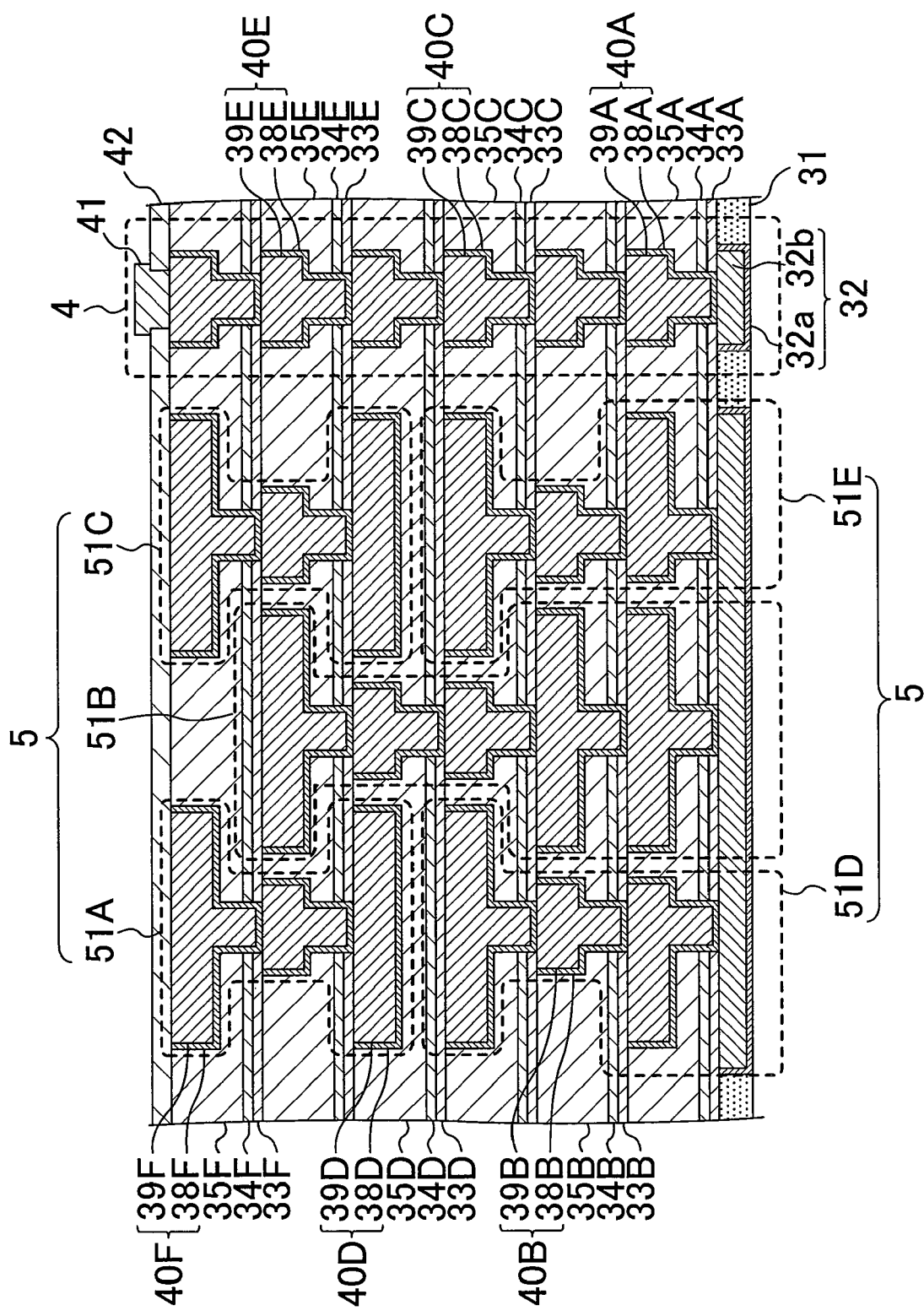
FIG. 11 is a sectional view illustrating a semiconductor device according to a second embodiment of the present invention.

FIG. 11 is a sectional view of a semiconductor device according to the second embodiment, in particular a semiconductor chip provided with wiring structures. FIG. 11 corresponds to FIG. 10 illustrating the semiconductor device of the first embodiment. In FIG. 11, the same components as those shown in FIG. 1 to 10 are indicated by the same reference numerals for easy explanation.

As shown in FIG. 11, a seal ring 4 made of a first (bottommost)-layer wiring 32, second to seventh-layer wirings 40A to 40F and a cap 41 is provided at the periphery of each of the chip regions 1 in the same manner as in the first embodiment. A chip strength reinforcement 5 made of a plurality of dummy wiring structures (e.g., dummy wiring structures 51A to 51E) is provided at each of the corners of the chip region 1 outside the seal ring 4. Each of the dummy wiring structures is formed to extend across and within two or more wiring layers including one or none of the bottommost and topmost wiring layers using the via portion. Among the plurality of dummy wiring structures, at least a portion of a dummy wiring structure and at least a portion of at least any other one of the dummy wiring structures are formed in at least one same wiring layer. Further, at least one of the dummy wiring structures has a portion formed in one of the wiring layers in which at least any one of the other dummy wiring structures are not formed.

A feature of the second embodiment is that at least two of the dummy wiring structures have a portion formed in the bottommost wiring layer, respectively.

Specifically, dummy wiring structures 51A and 51C are made of the fifth to seventh-layer wirings 40D to 40F. A dummy wiring structure 51B is made of the first to sixth-layer wirings 32 to 40E and a dummy wiring structure 51D is made of the first to fourth-layer wirings 32 to 40C. Further, a dummy wiring structure 51E is made of the first to fourth-layer wirings 32 to 40C. In this manner, the dummy wiring structures 51B, 51D and 51E have portions formed in the bottommost wiring layer, respectively.

According to the second embodiment, the following effect is obtained in addition to the effect of the first embodiment. It is considered that the interface between the third insulating film 34A made of a silicon carbon oxide film (SiCO film) and the fourth insulating film 35A made of a carbon-containing silicon oxide film (SiOC film) formed over the first (bottommost)-layer wiring 32 is inferior in adhesion property to the other interfaces because the mechanical characteristics of the two insulating films are significantly different. In the present embodiment, however, the via portions of the dummy wiring structures 51B, 51D and 51E (the via portions connecting the first (bottommost)-layer wiring 32 and the second-layer wiring 40A) realize the connection between the third and fourth insulating films 34A and 35A. Therefore, the adhesion at the interface between the two insulating films improves. Accordingly, the crack, peeling or the like of the interlayer insulating film derived from the mechanical or thermal stress during assembly into a package or the like is surely prevented.

Among the plurality of dummy wiring structures providing the chip strength reinforcement 5 of the second embodiment, if a first dummy wiring structure is positioned above a second dummy wiring structure and at least two portions of the first dummy wiring structure are formed in at least two wiring layers and at least two portions of the second dummy wiring structures are formed in the same at least two wiring layers, it is preferred to meet the following condition in order to prevent the crack, peeling or the like of the interlayer insulating film with reliability. Specifically, one of the at least two portions of the first dummy wiring structure formed in one of the at least two wiring layers and one of the at least two portions of the second dummy wiring structure formed in the other of the at least two wiring layers overlap each other when viewed in plan. More specifically, in the second embodiment shown in FIG. 11, the above-described condition is satisfied between the dummy wiring structures 51A and 51B, 51C and 51B, 51B and 51D, and 51B and 51E.

Among the plurality of dummy wiring structures serving as the chip strength reinforcement 5 of the first embodiment, if at least a portion of one dummy wiring structure formed in at least one of the wiring layers and at least a portion of another wiring structure formed in the same wiring layer are separated from each other, other portions of both of the dummy wiring structures formed in other wiring layers may be connected to each other.

Modified Example of Second Embodiment

Hereinafter, explanation of a semiconductor device and its manufacture method according to a modified example of the second embodiment of the present invention will be provided.

In the second embodiment described above, the dummy wiring structures 51A to 51E, for example, are provided to function as the chip strength reinforcement 5.

In the modified example, however, some or all of the dummy wiring structures having portions formed in the bottommost wiring layer, e.g., the dummy wiring structures 51A to 51C, are not provided. By so doing, the crack, peeling or the like of the interlayer insulating film derived from the mechanical or thermal stress during assembly into a package or the like is prevented with reliability while the area occupied by the dummy wiring structures is reduced.

Further, in the second embodiment described above, overlapping portions are observed between the dummy wiring structures 51A and 51B, 51C and 51B, 51B and 51D and 51B and 51E.

In the modified example, however, some or all of the overlapping portions of the dummy wiring structures are not provided. By so doing, the crack, peeling or the like of the interlayer insulating film derived from various stresses is prevented with reliability while the area occupied by the dummy wiring structures is reduced.

Third Embodiment

Hereinafter, explanation of a semiconductor device and its manufacture method according to a third embodiment will be provided with reference to the drawings.

Figure 12:
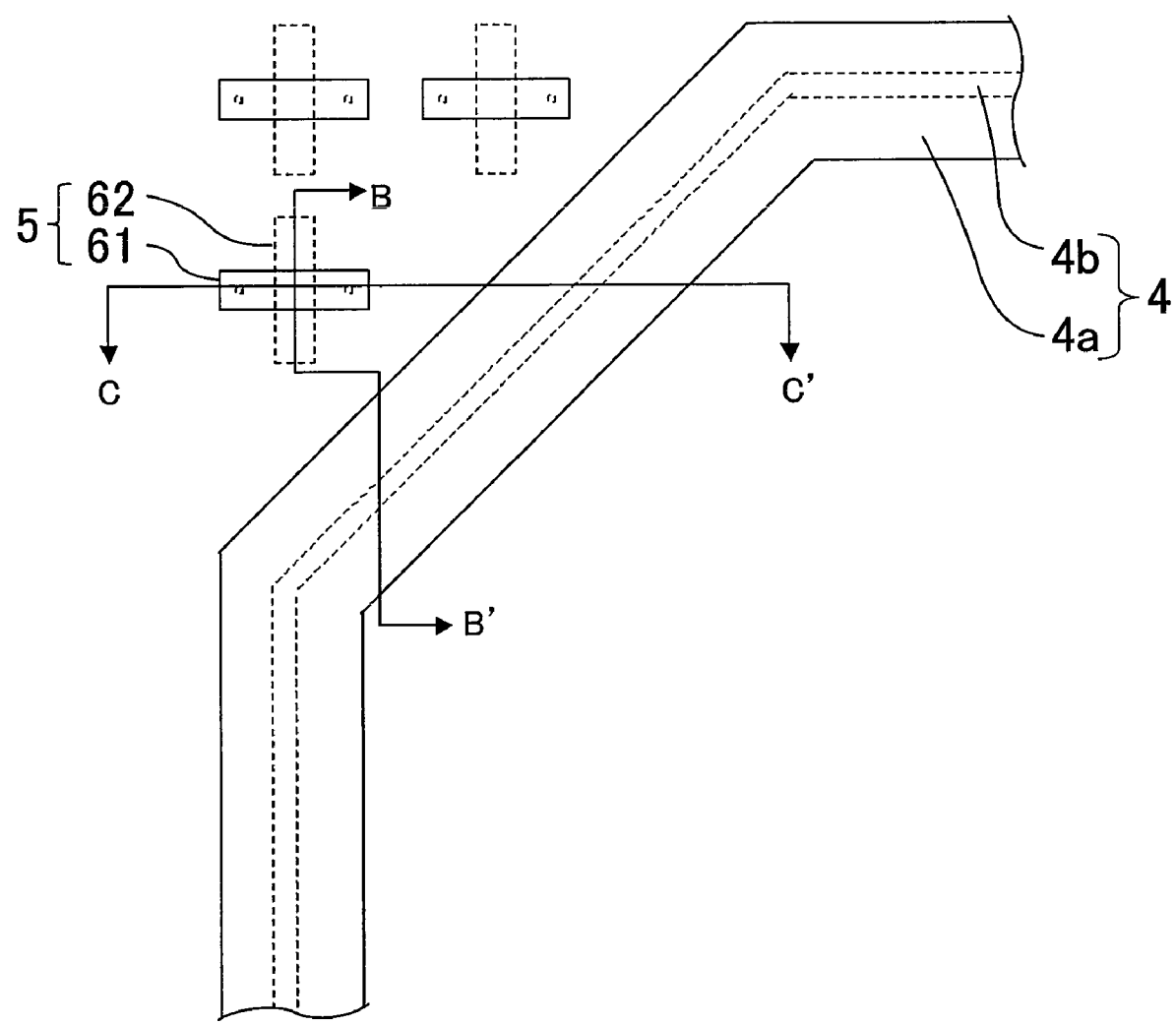
FIG. 12 is an enlarged plan view illustrating the upper left corner of a chip region of a semiconductor device according to a third embodiment of the present invention.
Figure 13:
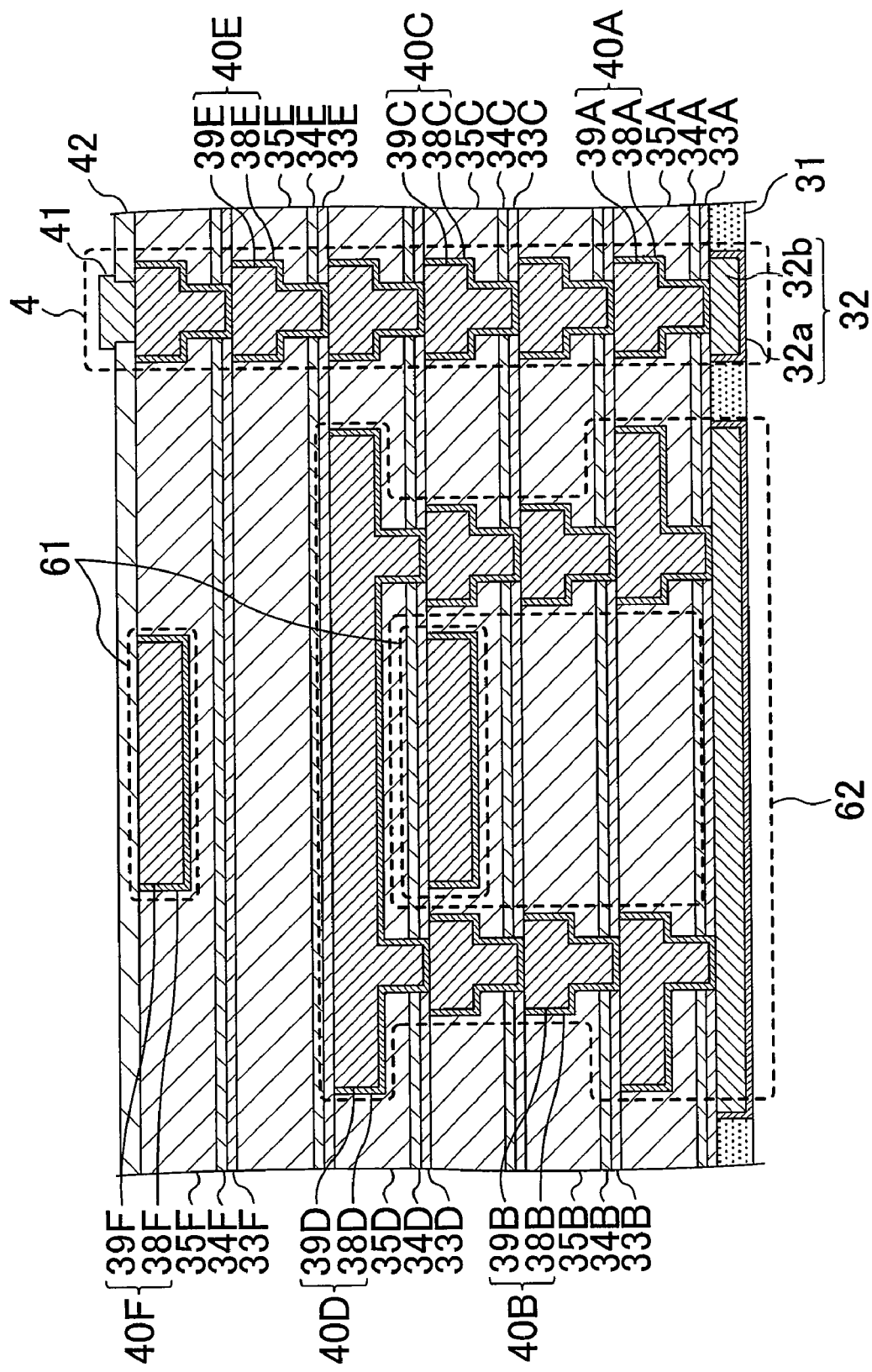
FIG. 13 is a sectional view taken along the line B-B' shown in FIG. 12.
Figure 14:
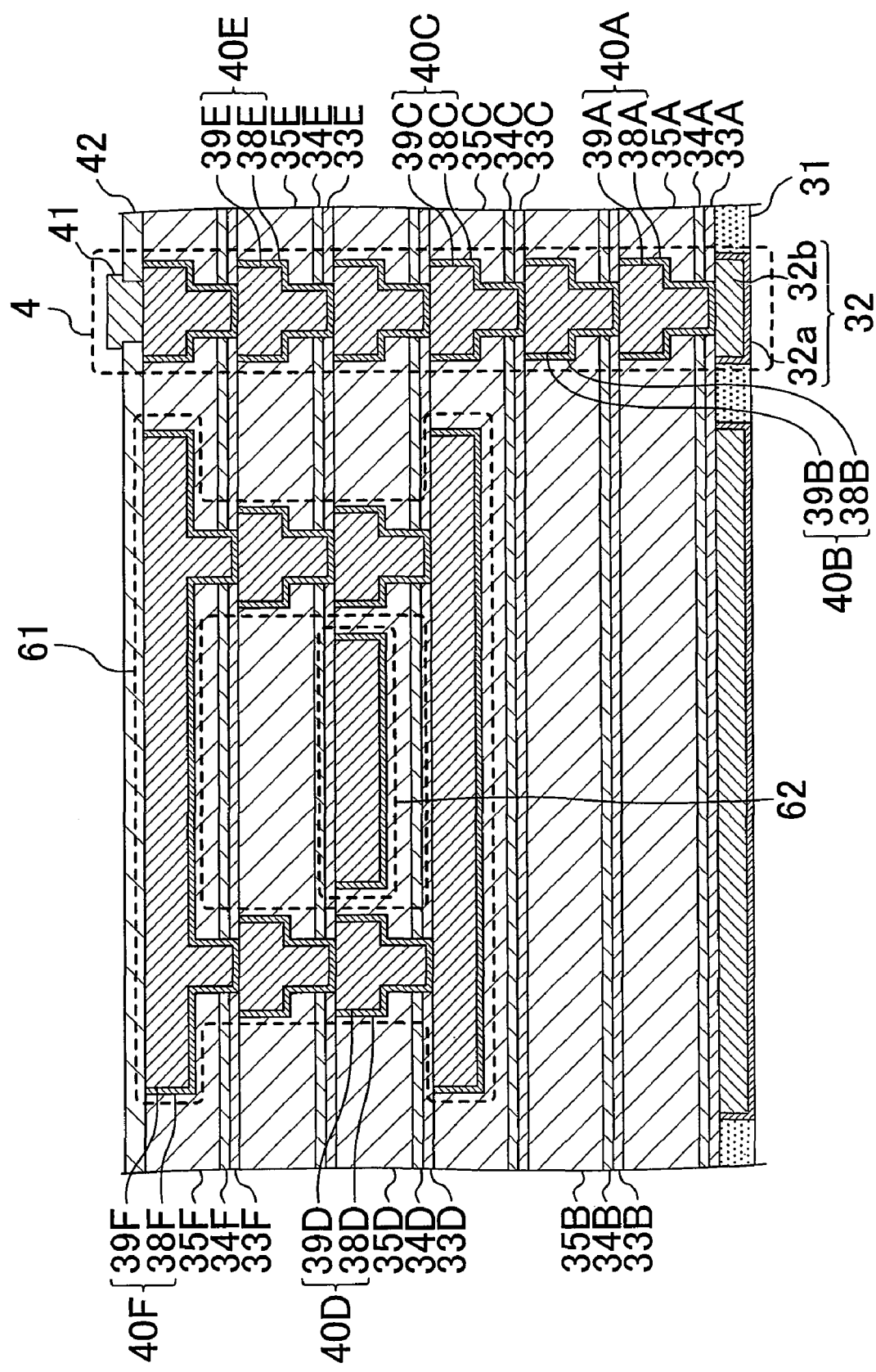
FIG. 14 is a sectional view taken along the line C-C' shown in FIG. 12.

FIG. 12 is an enlarged plan view of the upper left corner of a chip region of a semiconductor device according to the third embodiment (in particular a semiconductor chip provided with wiring structures) similar to the enlargement of the region R indicated in FIG. 1. FIG. 13 is a sectional view taken along the line B-B' of FIG. 12 and FIG. 14 is a sectional view taken along the line C-C' of FIG. 12. In FIGS. 12 to 14, the same components as those of the first embodiment shown in FIGS. 1 to 10 are indicated by the same reference numerals for easy explanation.

As shown in FIGS. 12 to 14, a seal ring 4 made of a first (bottommost)-layer wiring 32, second to seventh-layer wirings 40A to 40F and a cap 41 is provided at the periphery of each of the chip regions 1 in the same manner as in the first embodiment. A chip strength reinforcement 5 made of a plurality of dummy wiring structures (e.g., dummy wiring structures 61 and 62) is provided at each of the corners of the chip region 1 outside the seal ring 4. Each of the dummy wiring structures is formed to extend across and within two or more wiring layers including one or none of the bottommost and topmost wiring layers using a via portion. Among the plurality of dummy wiring structures, at least a portion of a dummy wiring structure and at least a portion of at least any other one of the dummy wiring structures are formed in at least one same wiring layer. Further, at least one of the dummy wiring structures has a portion formed in one of the wiring layers in which at least any other one of the dummy wiring structures are not formed.

One of the features of the third embodiment is that the dummy wiring structures providing the chip strength reinforcement 5 is made of a dummy wiring structure 61 and a dummy wiring structure 62 whose topmost portion is positioned below the topmost portion of the dummy wiring structure 61. Further, at least two portions of the dummy wiring structure 61 are formed in at least two wiring layers and at least two portions of the dummy wiring structure 62 are formed in the same at least two wiring layers and one of the at least two portions of the dummy wiring structure 61 formed in one of the at least two wiring layers and one of the at least two portions of the dummy wiring structure 62 formed in the other of the at least two wiring layers overlap each other when viewed in plan.

Figure 15:
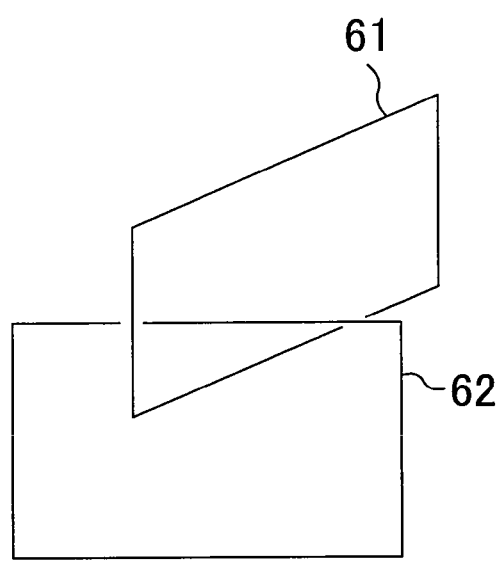
FIG. 15 is a schematic view illustrating a combination of ring-shaped dummy wiring structures serving as a chip strength reinforcement of a semiconductor device according to a third embodiment of the present invention.

The other feature of the third embodiment is that each of the dummy wiring structures 61 and 62 is formed to extend across and within three or more wiring layers using via portions and configured in the form of a ring (when viewed in section). Further, a portion of the dummy wiring structure 61 is arranged inside the ring-shaped dummy wiring structure 62 and a portion of the dummy wiring structure 62 is arranged inside the ring-shaped dummy wiring structure 61. FIG. 15 schematically shows the ring-shaped dummy wiring structures 61 and 62 in a combined state. The dummy wiring structures 61 and 62 are not electrically connected.

More specifically, the dummy wiring structure 61 is made of the fourth to seventh-layer wirings 40C to 40F and the dummy wiring structure 62 is made of the first to fifth-layer wirings 32 to 40D. The fourth-layer wiring 40C of the dummy wiring structure 61 is arranged inside the ring-shaped dummy wiring structure 62 and the fifth-layer wiring 40D of the dummy wiring structure 62 is arranged inside the ring-shaped dummy wiring structure 61. That is, the fourth-layer wiring 40C of the dummy wiring structure 61 and the fifth-layer wiring 40D of the dummy wiring structure 62 overlap each other when viewed in plan.

According to the third embodiment, the ring-shaped dummy wiring structures are combined. Therefore, the crack, peeling or the like of the interlayer insulating film derived from the mechanical or thermal stress during assembly into a package or the like is surely prevented.

According to the third embodiment, both of the dummy wiring structures 61 and 62 are ring-shaped. However, one of the dummy wiring structures 61 and 62 may be ring-shaped and a portion of the other may be arranged inside the ring-shaped dummy structure. Even in this case, the crack, peeling or the like of the interlayer insulating film derived from various stresses is surely prevented.

According to the third embodiment, the ring-shaped dummy wiring structure 61 is formed to extend across and within four layers and the ring-shaped dummy wiring structure 62 is formed to extend across and within five layers.

However, the number of layers of the ring-shaped dummy wiring structures is not particularly limited and may suitably be changed in accordance with the position of the dummy wiring structures. Further, each of the dummy wiring structures 61 and 62 according to the third embodiment are configured in the form of a simple closed curve. However, the number of the ring-shaped structures (closed curves) forming the dummy wiring structures is not particularly limited and may be changed in accordance with the position of the dummy wiring structures and the number of required wiring layers. Specifically, the dummy wiring structure may describe a figure of eight, a ladder or the like. Or alternatively, the ring-shaped dummy wiring structures may be combined with ring-shaped structures of a ladder-shaped dummy wiring structure, respectively, from above or below. In the third embodiment, the dummy wiring structures having ring-shaped sections, respectively, are combined. However, a dummy wiring structure which is ring-shaped when viewed in section and a dummy wiring structure which is ring-shaped when viewed in plan (the number of required layers may be 1) may be combined. Thus, the third embodiment of the present invention may vary in different ways.

In the third embodiment, if at least a portion of the dummy wiring structure 61 formed in at least one of the wiring layers and at least a portion of the wiring structure 62 formed in the same wiring layer are separated from each other, other portions of both of the dummy wiring structures 61 and 62 formed in other wiring layers may be connected to each other.

Fourth Embodiment

Hereinafter, explanation of a semiconductor device and its manufacture method according to a fourth embodiment of the present invention will be provided with reference to the drawings.

Figure 16:
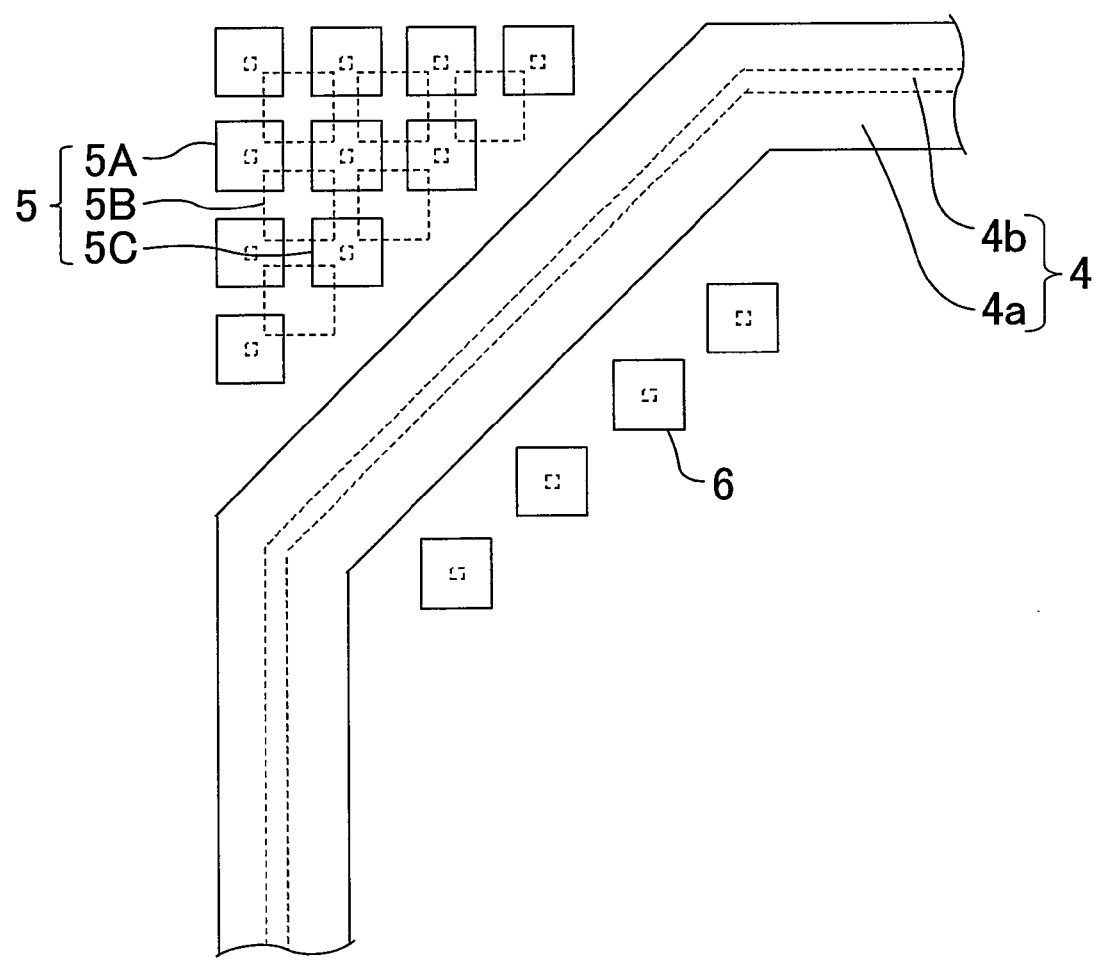
FIG. 16 is an enlarged plan view illustrating the upper left corner of a chip region of a semiconductor device according to a fourth embodiment of the present invention.

FIG. 16 is an enlarged plan view of the upper left corner of a chip region of a semiconductor device (in particular a semiconductor chip provided with wiring structures) similar to the enlargement of the region R indicated in FIG. 1. In FIG. 16, the same components as those of the first embodiment shown in FIGS. 1 to 10 are indicated with the same reference numerals for easy explanation.

As shown in FIG. 16, a seal ring 4 is provided at the periphery of the chip region 1 to surround a circuit region in the same manner as in the first embodiment. The seal ring 4 is provided by stacking ring-shaped patterns (when viewed in plan) each including a via portion 4b and a wiring portion 4a formed thereon. A chip strength reinforcement 5 is provided at each of the corners of the chip region 1 outside the seal ring 4. The chip strength reinforcement 5 is made of a plurality of dummy wiring structures (e.g., dummy wiring structures 5A to 5C). The dummy wiring structures providing the chip strength reinforcement 5 have the same sectional configuration as that of the first embodiment shown in FIG. 10.

A feature of the fourth embodiment is that a chip strength reinforcement 6 made of a plurality of dummy wiring structures in the same manner as the chip strength reinforcement 5 is provided at each of the corners of the chip region 1 inside the seal ring 4 (in the circuit region).

According to the fourth embodiment, the following effect is obtained in addition to the effect of the first embodiment. Specifically, in addition to the improvement in mechanical strength of part of the interlayer insulating film around the dummy wiring structures serving as the chip strength reinforcement 5, the improvement in mechanical strength, particularly in the thickness direction, is also achieved in part of the interlayer insulating film around the dummy wiring structures serving as the chip strength reinforcement 6. Further, the stress derived from the difference in stress coefficient between the wiring material and the interlayer insulating film material is distributed to different points including not only the corners of the chip but also on the circuit region. As a result, the crack, peeling or the like of the interlayer insulating film derived from the mechanical or thermal stress during assembly into a package or the like is prevented with high reliability.

In the fourth embodiment, the dummy wiring structures providing the chip strength reinforcements 5 and 6 have the same sectional configuration as that of the first embodiment shown in FIG. 10. However, this configuration may be replaced with other sectional configurations such as that of the second embodiment shown in FIG. 11 or that of the third embodiment shown in FIGS. 13 and 14. The dummy wiring structures providing the chip strength reinforcement 6 may have a sectional configuration different from that of the dummy wiring structures providing the chip strength reinforcement 5.

Fifth Embodiment

Hereinafter, explanation of a semiconductor device and its manufacture method according to a fifth embodiment will be explained with reference to the drawings.

Figure 17:
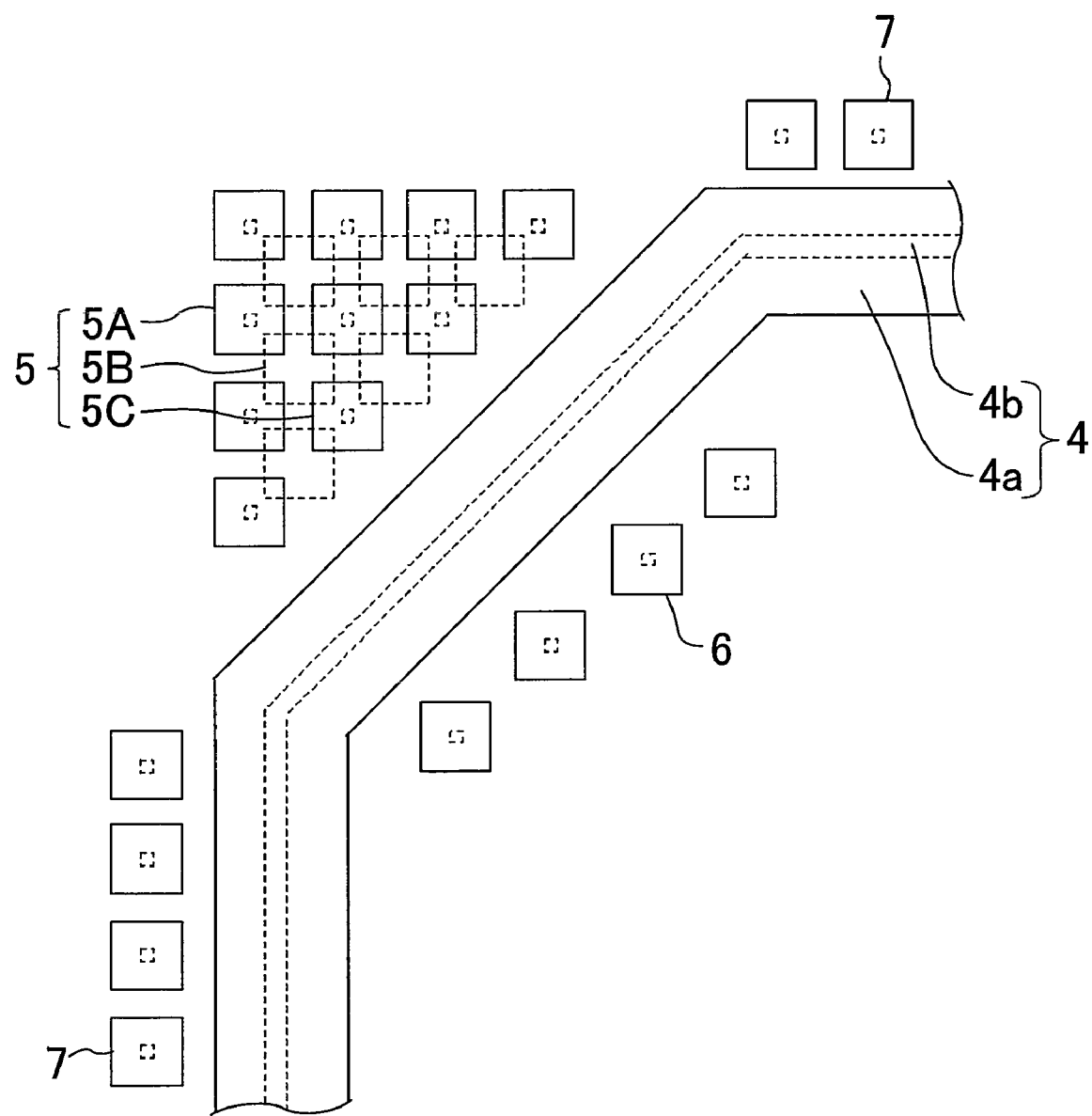
FIG. 17 is an enlarged plan view illustrating the upper left corner of a chip region of a semiconductor device according to a fifth embodiment of the present invention.

FIG. 17 is an enlarged plan view illustrating the upper left corner of a chip region of the semiconductor device according to the fifth embodiment (in particular a semiconductor chip provided with wiring structures) similar to the enlargement of the region R indicated in FIG. 1. In FIG. 17, the same components as those of the first embodiment shown in FIGS. 1 to 10 are indicated by the same reference numerals for easy explanation.

As shown in FIG. 17, a seal ring 4 is provided at the periphery of the chip region 1 to surround a circuit region in the same manner as in the first embodiment. The seal ring 4 is provided by stacking ring-shaped patterns (when viewed in plan) each including a via portion 4b and a wiring portion 4a formed on the via portion 4b. A chip strength reinforcement 5 is provided at each of the corners of the chip region 1 outside the seal ring 4. The chip strength reinforcement 5 is made of a plurality of dummy wiring structures (e.g., dummy wiring structures 5A to 5C). The dummy wiring structures providing the chip strength reinforcement 5 have the same sectional configuration as that of the first embodiment shown in FIG. 10.

As features of the fifth embodiment, a chip strength reinforcement 6 made of a plurality of dummy wiring structures just like the chip strength reinforcement 5 is provided at each of the corners of the chip region 1 inside the seal ring 4 (in the circuit region) and a chip strength reinforcement 7 made of a plurality of dummy wiring structures just like the chip strength reinforcement 5 is provided along the outer periphery of the chip region 1 outside the seal ring 4 except the chip corners.

According to the fifth embodiment, the following effect is obtained in addition to the effect of the first embodiment. Specifically, in addition to the improvement in mechanical strength of part of the interlayer insulating film around the chip strength reinforcement 5, the improvement in mechanical strength, particularly in the thickness direction, is also achieved in parts of the interlayer insulating film around the chip strength reinforcements 6 and 7. Further, the stress derived from the difference in stress coefficient between the wiring material and the interlayer insulating film material is distributed to different points including not only among the corners of the chip but also the circuit region and the outer periphery of the chip. As a result, the crack, peeling or the like of the interlayer insulating film derived from the mechanical or thermal stress during assembly into a package or the like is prevented with high reliability.

In the fifth embodiment, the chip strength reinforcements 5 to 7 have the same sectional configuration as that of the first embodiment shown in FIG. 10. However, this configuration may be replaced with other sectional configurations such as that of the second embodiment shown in FIG. 11 or that of the third embodiment shown in FIGS. 13 and 14. Alternatively, two or more different sectional configurations may be used for the chip strength reinforcements 5 to 7.

Sixth Embodiment

Hereinafter, explanation of a semiconductor device and its manufacture method according to a sixth embodiment of the present invention will be provided with reference to the drawings.

Figure 18:
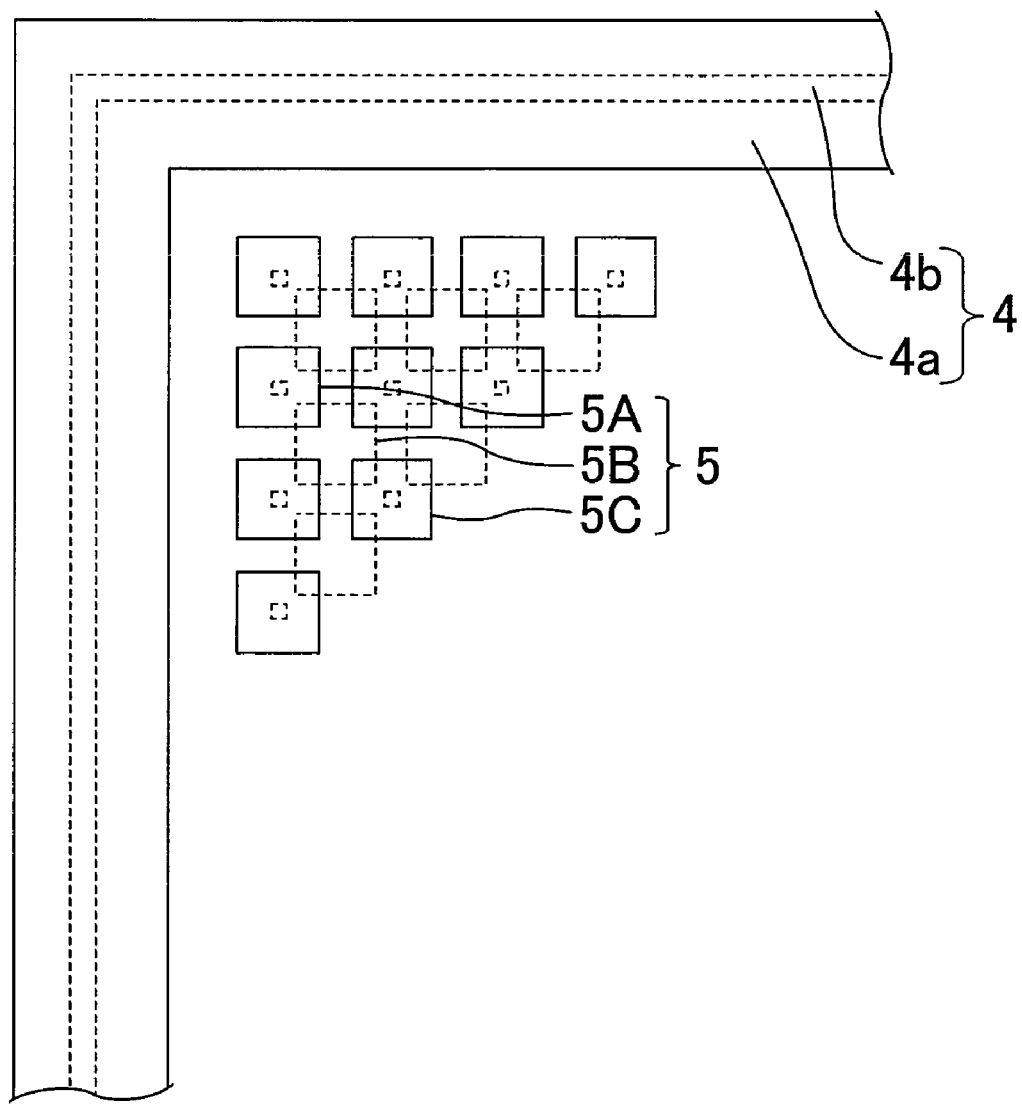
FIG. 18 is an enlarged plan view illustrating the upper left corner of a chip region of a semiconductor device according to a sixth embodiment of the present invention.

FIG. 18 is an enlarged plan view of the upper left part of a chip region of the semiconductor device of the sixth embodiment (in particular a semiconductor chip provided with wiring structures) similar to the enlargement of the region R indicated in FIG. 1. In FIG. 18, the same components as those of the first embodiment shown in FIGS. 1 to 10 are indicated by the same reference numerals for easy explanation.

As shown in FIG. 18, a seal ring 4 is provided at the periphery of the chip region 1 to surround a circuit region in the same manner as in the first embodiment. The seal ring 4 is provided by stacking ring-shaped patterns (when viewed in plan) each including a via portion 4b and a wiring portion 4a formed on the via portion 4b.

A feature of the sixth embodiment, which is a difference from the first embodiment, is that the chip strength reinforcement 5 is provided at each of the corners of the chip region 1 inside the seal ring 4. The chip strength reinforcement 5 is made of a plurality of dummy wiring structures (e.g., dummy wiring structures 5A to 5C) and has the same sectional configuration as that of the first embodiment shown in FIG. 10.

The peeling, crack or the like of the interlayer insulating film during assembly into a package, for example, begins at the corners of the chip in many cases. If the chip strength reinforcement 5 is provided at each of the corners of the chip inside the seal ring 4 as described in the present embodiment, such peeling or the like is prevented sufficiently. In other words, in the same manner as in the first embodiment, part of the interlayer insulating film around the dummy wiring structures improves in mechanical strength, particularly in the thickness direction, and the stress derived from the difference in stress coefficient between the wiring material and the interlayer insulating film material is distributed to different points. Therefore, the crack, peeling or the like of the interlayer insulating film derived from mechanical or thermal stress during assembly into a package or the like is prevented with reliability, thereby preventing the occurrence of failure.

In the sixth embodiment, the dummy wiring structures providing the chip strength reinforcement 5 have the same sectional configuration as that of the first embodiment shown in FIG. 10. However, this sectional configuration may be replaced with that of the second embodiment shown in FIG. 11 or that of the third embodiment shown in FIGS. 13 and 14.

In the first to sixth embodiments and their modified examples, the bottommost-layer wiring 32 may be replaced with an impurity layer formed in the surface of the semiconductor substrate.

In the first to sixth embodiments and their modified examples, the plurality of dummy wiring structures providing the chip strength reinforcements 5 to 7 may be replaced with wiring structures arranged in the same manner as the dummy wiring structures to function as signal lines or power source lines.

In the first to sixth embodiments and their modified examples, for the purpose of preventing the crack, peeling or the like of the interlayer insulating film with high reliability, at least one of the dummy wiring structures providing the chip strength reinforcement 5, 6 or 7 preferably has a portion extending in a certain direction in at least one of the wiring layers and another portion extending in a different direction in the same wiring layer and being connected to the certain portion.

What is claimed is:

1. A semiconductor device comprising:
   a plurality of interlayer insulating films stacked on a semiconductor substrate;
   at least three or more wiring layers formed in the plurality of interlayer insulating films; and
   a chip strength reinforcement formed in the plurality of interlayer insulating films, wherein
   the chip strength reinforcement is made of a plurality of dummy wiring structures and
   each of the plurality of dummy wiring structures is formed to extend across and within two or more of the wiring layers including only one or none of the bottommost wiring layer and the topmost wiring layer using a via portion.

2. The semiconductor device of claim 1, wherein
   at least two of the plurality of dummy wiring structures have at least a portion formed in the same wiring layer.

3. The semiconductor device of claim 1, wherein
   at least one of a pair of dummy wiring structures among the plurality of dummy wiring structures has a portion formed in one of the wiring layers in which the other of the pair is not formed.

4. The semiconductor device of claim 1, wherein
   at least two of the plurality of dummy wiring structures have a portion formed in the bottommost wiring layer.

5. The semiconductor device of claim 1, wherein
   at least one of the plurality of dummy wiring structures has a portion extending in a certain direction in at least one of the wiring layers and another portion extending in a different direction in the same wiring layer and being connected to the certain portion.

6. The semiconductor device of claim 1, wherein
   the plurality of dummy wiring structures include a first dummy wiring structure and a second dummy wiring structure whose topmost portion is positioned below the topmost portion of the first dummy wiring structure,
   at least two portions of the first dummy wiring structure are formed in at least two wiring layers, respectively, and at least two portions of the second dummy wiring structure are formed in the same at least two wiring layers, respectively, and
   one of the at least two portions of the first dummy wiring structure formed in one of the at least two wiring layers and one of the at least two portions of the second dummy wiring structure formed in the other of the at least two wiring layers overlap each other when viewed in plan.

7. The semiconductor device of claim 6, wherein
   the second dummy wiring structure is formed to extend across and within three or more wiring layers using via portions and configured in the form of a ring and a portion of the first dummy wiring structure is positioned inside the ring-shaped second dummy wiring structure.

8. The semiconductor device of claim 7, wherein the first dummy wiring structure is formed to extend across and within three or more wiring layers using via portions and configured in the form of a ring and a portion of the second dummy wiring structure is positioned inside the ring-shaped first dummy wiring structure.

9. The semiconductor device of claim 1, wherein each of the plurality of dummy wiring structures contains copper.

10. The semiconductor device of claim 1, wherein the plurality of dummy wiring structures are provided at the corners of the chip region of the semiconductor substrate.

11. The semiconductor device of claim 1, wherein at least one of the plurality of dummy wiring structures does not include the topmost wiring layer, and is formed to extend across and within two or more wiring layers including the bottommost wiring layer using a via portion.

12. The semiconductor device of claim 1, wherein at least one of the plurality of dummy wiring structures does not include the bottommost wiring layer, and is formed to extend across and within two or more wiring layers including the topmost wiring layer using a via portion.

13. The semiconductor device of claim 1, wherein at least one of the plurality of dummy wiring structures is formed to extend across and within two or more wiring layers including none of the topmost wiring layer and the bottommost wiring layer using a via portion.

14. The semiconductor device of claim 1, wherein the interlayer insulating film includes an insulating film made of low dielectric constant material.

15. The semiconductor device of claim 1, wherein the interlayer insulating film includes a silicon carbon nitride film.

16. The semiconductor device of claim 1, wherein the interlayer insulating film includes a silicon carbon oxide film.

17. The semiconductor device of claim 1, wherein the interlayer insulating film includes a carbon-containing silicon oxide film.

* * * * *